(12) United States Patent
Tamura

(10) Patent No.: US 8,071,435 B2
(45) Date of Patent: Dec. 6, 2011

(54) MANUFACTURE OF SEMICONDUCTOR DEVICE WITH STRESS STRUCTURE

(75) Inventor: Naoyoshi Tamura, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 137 days.

(21) Appl. No.: 12/606,720

(22) Filed: Oct. 27, 2009

(65) Prior Publication Data

US 2010/0047978 A1   Feb. 25, 2010

Related U.S. Application Data

(63) Continuation of application No. PCT/JP2007/000514, filed on May 14, 2007.

(51) Int. Cl.
   *H01L 21/8238* (2006.01)
(52) U.S. Cl. ........ 438/199; 438/269; 438/285; 438/300; 438/933; 257/E29.193
(58) Field of Classification Search .................. 438/199, 438/269, 285, 300, 933; 257/E29.193
See application file for complete search history.

(56) References Cited

U.S. PATENT DOCUMENTS

| | | | |
|---|---|---|---|
| 7,329,571 B2 * | 2/2008 | Hoentschel et al. | 438/199 |
| 7,579,262 B2 * | 8/2009 | Hoentschel et al. | 438/478 |
| 7,670,923 B1 * | 3/2010 | Nayak et al. | 438/413 |
| 7,875,543 B1 * | 1/2011 | Luo et al. | 438/597 |
| 2003/0080361 A1 | 5/2003 | Murthy et al. | |
| 2003/0181005 A1 | 9/2003 | Hachimine et al. | |
| 2004/0075148 A1 | 4/2004 | Kumagai et al. | |
| 2005/0285137 A1 | 12/2005 | Satoh | |
| 2006/0014354 A1 | 1/2006 | Chen et al. | |
| 2006/0172477 A1 | 8/2006 | Shima | |
| 2006/0231826 A1 | 10/2006 | Kohyama | |
| 2006/0281288 A1 | 12/2006 | Kawamura et al. | |
| 2007/0034963 A1 | 2/2007 | Sudo | |

FOREIGN PATENT DOCUMENTS

| | | |
|---|---|---|
| JP | 2003-086708 A | 3/2003 |
| JP | 2003-273240 A | 9/2003 |
| JP | 2006-013322 A | 1/2006 |

(Continued)

OTHER PUBLICATIONS

Kah Wee Ang, et al, "Enhanced Performance in 50nm N-MOSFETs with Silicon-Carbon Source/Drain Regions," IEDM Tech. Dig., 2004, p. 1069.

(Continued)

*Primary Examiner* — Thanh V Pham
(74) *Attorney, Agent, or Firm* — Westerman, Hattori, Daniels & Adrian, LLP

(57) ABSTRACT

A method for manufacturing a semiconductor device includes the steps of (a) forming a gate electrode on a silicon substrate, through a gate insulating film; (b) forming a lamination of an insulating film and a sacrificial film having different etching characteristics on the silicon substrate, covering the gate electrode, and anisotropically etching the lamination to form side wall spacers on side walls of the gate electrode and the gate insulating film; (c) implanting impurities into the silicon substrate on both sides of the side wall spacers; (d) etching the silicon substrate and the sacrificial film to form recesses in the silicon substrate, and to change a cross sectional shape of each of the side wall spacers to approximately an L-shape; (e) epitaxially growing Si—Ge-containing crystal in the recesses; and (f) depositing an insulating film containing stress, covering the side wall spacers.

14 Claims, 5 Drawing Sheets

FOREIGN PATENT DOCUMENTS

| | | |
|---|---|---|
| JP | 2006-202951 A | 8/2006 |
| JP | 2006-303501 A | 11/2006 |
| JP | 2006-351581 A | 12/2006 |
| JP | 2007-049166 A | 2/2007 |

OTHER PUBLICATIONS

International Search report of PCT/JP2007/000514, mailing date of Aug. 7, 2007.

T. Ghani, et al, "A 90nm High Volume Manufacturing Logic Technology Featuring Novel 45nm Gate Length Strained Silicon CMOS Transistors," IEDM Tech. Dig., 2003, p. 978.

Written Opinion for PCT/JP2007/000514, mailing date Aug. 7, 2007 (with partial translation).

Kim, Y. S. et al.; "A Highly Robust SiGe Source Drain Technology realized by Disposable Sidewall Spacer (DSW) for 65nm Node and Beyond"; Proceedings of ESSDERC 2005.

* cited by examiner

MANUFACTURE OF SEMICONDUCTOR DEVICE WITH STRESS STRUCTURE

CROSS-REFERENCE TO RELATED APPLICATION

This application is a continuation application of PCT/JP2007/000514, filed on May 14, 2007, the entire contents of which are incorporated herein by reference.

FIELD

The embodiments discussed herein are related to a semiconductor device manufacture method.

BACKGROUND

MOS transistor has been developed along the basic principle that "it is possible to realize high speed through miniaturization" according to a scaling rule. However, as the result of progress of excessive miniaturization, it is necessary to increase amount of impurities to be doped in a channel region in order to suppress rapid reduction in the threshold voltage to be caused by miniaturization. Because of "impurity" scattering, mobility of carriers (electrons, holes) transporting from the source to drain reduces greatly. In order to suppress this mobility reduction, various countermeasures have been adopted for forcibly applying "strain" to a silicon atom group constituting the channel.

Electron mobility in an n-channel (N) MOS transistor is improved by applying tensile stress to the channel. Hole mobility in a p-channel (P) MOS transistor is improved by applying compressive stress to the channel.

Japanese Patent Laid-open Publication No. 2003-86708 and its family US 2004/0075148, the whole contents of which are incorporated herein by reference, disclose that in case where the gate length direction is disposed along a <110>direction on an Si (001) surface, NMOS increases an on-current upon application of tensile strain along the gate length direction, and increases an on-current upon application of tensile strain along the gate width direction, whereas PMOS reduces an on-current upon application of tensile strain along the gate length direction (increases an on-current upon application of compressive strain along the gate length direction), and increases an on-current upon application of tensile strain along the gate width direction. These documents further disclose that by forming the contact etch stopper film with a tensile stress film above the NMOS region and forming the contact etch stopper film with a compressive stress film above the PMOS region, the whole characteristics of CMOS can be improved and stress can be adjusted by an area of the contact etch stopper film.

Japanese Patent Laid-open Publication No. 2003-273240 and its family US 2003/0181005, the whole contents of which are incorporated herein by reference, disclose that in the state that the semiconductor surface between the gate electrode and the isolation region is covered with an insulating film functioning as a contact etch stopper, a tensile stress film is formed above the NMOS region and a compressive stress film is formed above the PMOS region.

Japanese Patent Laid-open Publication No. 2006-13322 and its family US 2005/0285137, the whole contents of which are incorporated herein by reference, analyses stresses in various directions and the performances of NMOS and PMOS formed in a silicon substrate comprehensively and proposes to release the stress of a compressive stress film formed on PMOS on the isolation region.

It is also possible to apply stress to a channel by means other than the etch stopper.

When the source/drain regions of an NMOS transistor are made of silicon-carbon (Si—C) mixed crystal (C-doped Si) having a lattice constant smaller than the Si substrate, tensile stress is applied to the Si crystal in the channel region and electron mobility becomes high. Refer to K. Ang et al: IEDM Tech. Dig., 2004, p. 1069, the whole contents of which are incorporated herein by reference.

When the source/drain regions of a PMOS transistor are made of silicon-germanium (Si—Ge) mixed crystal having a lattice constant larger than the Si substrate, compressive stress is applied to the Si crystal in the channel region and hole mobility becomes high. Refer to T. Ghani et al: IEDM Tech. Dig., 2003, p. 978 and Y. S. Kim et al: Proceedings of ESS-DERC 2005, p. 305, the whole contents of which are incorporated herein by reference.

By applying stress to the channel of a MOS transistor, it becomes possible to increase carrier mobility and improve the performance of the MOS transistor. Electron mobility in an NMOS transistor is increased by tensile stress, and hole mobility in a PMOS transistor is increased by compressive stress.

It is possible to apply desired stresses to PMOS and NMOS transistors, by etching and digging the source/drain regions of a PMOS transistor and growing Si—Ge crystal and by etching and forming the recess in the source/drain regions of an NMOS transistor and growing Si—C crystal. However, in this case, manufacture processes become complicated. More simpler manufacture processes are desired.

Thus, studies are being made on the structure in which the source/drain regions of a PMOS transistor are etched to form recesses, Si—Ge (or Si—Ge—C) crystal is grown in the recesses to apply compressive stress to the channel, after forming a silicide layer, a nitride film having tensile stress is deposited on the NMOS transistor to apply tensile stress to the channel of a NMOS transistor.

A complementary type semiconductor device may be formed through burying crystal having a larger lattice constant than silicon in the source/drain regions of PMOS, forming a compression stress film on PMOS, and forming a tensile stress film on NMOS. It is desired to improve the performance of the semiconductor device of this type and stabilize the manufacturing processes.

SUMMARY

According to an aspect of the embodiments, a method for manufacturing a semiconductor device includes:

(a) forming a gate electrode on a silicon substrate, through a gate insulating film;

(b) forming a lamination of an insulating film and a sacrificial film having different etching characteristics on the silicon substrate, covering said gate electrode, and anisotropically etching the lamination to form side wall spacers on side walls of the gate electrode and the gate insulating film;

(c) implanting impurities into the silicon substrate on both sides of the side wall spacers;

(d) etching the silicon substrate and a portion of the lamination of the side wall spacers to form recesses in the silicon substrate and change a cross sectional shape of each of the side wall spacers to approximately an L-shape;

(e) epitaxially growing Si—Ge-containing crystal in the recesses; and (f) depositing an insulating film containing stress, covering the side wall spacers.

According to another aspect of the embodiments, a method for manufacturing a complementary type semiconductor device includes:
(a) forming gate electrodes in a PMOS region and an NMOS region on a silicon substrate, through a gate insulating film;
(b) forming an insulating layer including a silicon nitride film and a silicon oxide film formed thereon on the silicon substrate, covering the gate electrodes, and further forming a sacrificial layer on the insulating layer;
(c) anisotropically etching the sacrificial film to leave the sacrificial film only on side walls of the gate electrode in a side wall spacer shape;
(d) covering the NMOS region with a mask, further anisotropically etching the insulating film to pattern the insulating layer by using the sacrificial film as an etching mask to expose silicon surface in the PMOS region;
(e) removing the mask covering the NMOS region, etching regions of the silicon substrate with exposed silicon surface in the PMOS region to form recesses, and removing the sacrificial film while leaving the silicon oxide film which has been covered with the sacrificial film;
(f) epitaxially growing Si—Ge-containing crystal in the recesses;
(g) anisotropically etching the silicon nitride film not covered with the silicon oxide film in the NMOS region;
(h) forming a silicon nitride film having tensile stress above the NMOS region; and
(i) forming a silicon nitride film having compressive stress above the PMOS region.

The insulating film for applying stress to strain the channel is desired to be formed at a position as near to the channel as possible. Since the sacrificial film is removed at the same time when the recesses are formed, the processes are simple and the strain applying structure can be obtained stably.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Embodiments of the present invention will be described with reference to the accompanying drawings.

Description will be made on main processes of a method for manufacturing a semiconductor device according to the first embodiment with reference to FIGS. 1A to 1O.

First, an isolation region is formed in a surface layer of a silicon substrate to define a plurality of active regions.

Figure 1A:
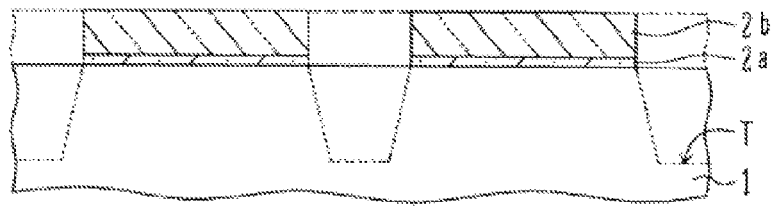
FIGS. 1A to 1O are cross sectional views of a semiconductor substrate illustrating main processes of a method for manufacturing a complementary type semiconductor device according to a first embodiment.

As illustrated in FIG. 1A, a silicon oxide (abbreviated to SiO in some cases) film 2a having a thickness of about 10 nm is formed, for example, by dry thermal oxidation at 900° C., and then a silicon nitride (abbreviated to SiN in some cases) film 2b having a thickness of about 110 nm is deposited by chemical vapor deposition (CVD) at 750° C. using $SiH_2Cl_2$/$NH_3$.

A photoresist pattern having an opening corresponding to the isolation region is formed by photolithography, the silicon nitride film exposed in the opening is etched, and a trench T having a depth of about 300 nm is formed in the surface layer of the silicon substrate, by using the patterned silicon nitride film as a hard mask. Etching gas may be $CF_4$ for SiN, $CF_4/N_2$ mixed gas for SiO, and $CF_4/O_2/N_2$ for Si, etc.

Insulator, e.g., a silicon oxide film formed by high density (HD) plasma enhanced (PE-) CVD, is deposited on the substrate to bury the trench T. An unnecessary silicon oxide film on the silicon nitride film 2b is polished and removed by chemical mechanical polishing (CMP) to form the embedded isolation structure. In this manner, an isolation region 3 (FIG. 1B) is formed by shallow trench isolation (STI). The silicon nitride film 2b on each active region defined by the isolation region is removed by a wet process, e.g., with phosphoric acid heated to 150° C. The exposed oxide film 2a is removed with hydrofluoric acid.

Figure 1B:
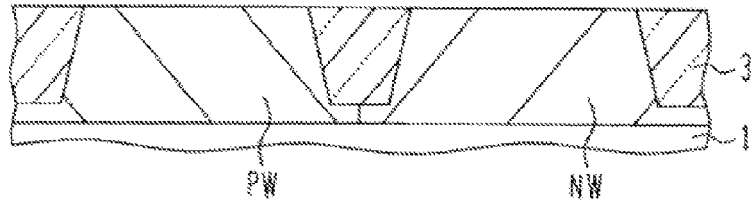

As illustrated in FIG. 1B, p-type impurities, e.g., B ions, and n-type impurities, e.g., P ions, are selectively implanted by using resist patterns to form a p-type well PW and an n-type well NW. The p-type well PW constitutes an NMOS region for forming an NMOS transistor, and the n-type well NW constitutes a PMOS region for forming a PMOS transistor. The p-type well and n-type well are collectively called active region(s) in some cases.

Figure 1C:
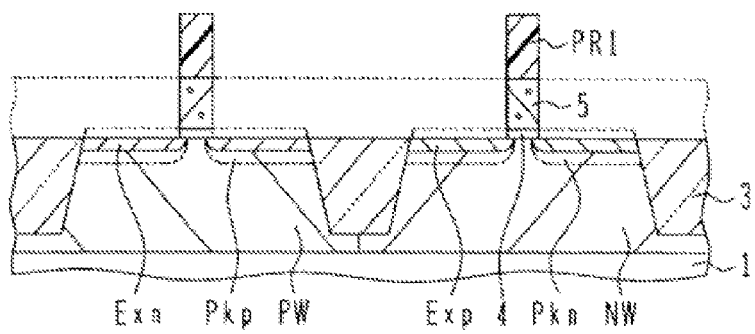
Figure 1C:
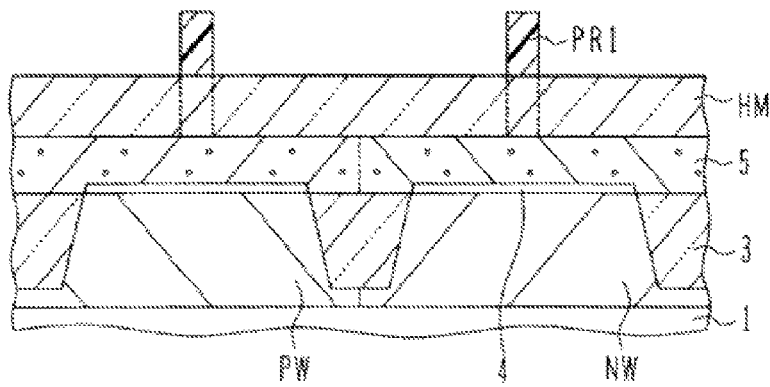

As illustrated in FIG. 1C, a thermally oxidized film 4 having a thickness of about 1.5 nm is formed, for example, by dry oxidation. Thereafter, a polysilicon layer 5 is deposited, for example, to a thickness of about 100 nm by CVD at a temperature of about 600° C. Impurity ions are doped in the polysilicon layer 5 by using resist masks. In the NMOS region, phosphorus P ions are implanted, e.g., at $8 \times 10^{15}$ $cm^{-2}$, and in the PMOS region, boron B ions are implanted, e.g., at $6 \times 10^{15}$ $cm^{-2}$. Implanted impurity ions are activated by rapid thermal annealing (RTA), e.g., at 1000° C. for about 10 seconds.

After activation, photoresist patterns PR1 of a gate electrode shape are formed on the polysilicon layer 2b, and the polysilicon layer is patterned by etching to form gate electrodes 5. Thereafter, the photoresist patterns PR1 are removed. If a gate electrode having a short gate length is to be patterned, it is preferable to use a hard mask.

As alternatively illustrated in FIG. 1CX, after impurity ions are implanted into the polysilicon layer 5 and activated, a hard mask layer HM such as a silicon oxide film is deposited on the polysilicon layer 5 by low temperature CVD. Photoresist patterns PR1 are formed on the hard mask layer HM, and the hard mask layer HM is etched by using the photoresist patterns PR1 as a mask. Thereafter, the photoresist patterns PR1 are removed. The patterns of the hard mask layer HM are trimmed if necessary, and the polysilicon layer 5 is etched by using the hard mask layer patterns as a mask. By using the hard mask layer, it becomes possible to pattern reliably a finer gate electrode. The patterns of the hard mask layer HM may be left without being removed.

Reverting to FIG. 1C, by selecting the NMOS region and PMOS region by using resist masks, impurity ions are implanted into the NMOS region and PMOS region to form extensions of sources/drains and pockets. With respect to the NMOS region, ions, e.g., As ions, are implanted into the p-type well PW at an acceleration energy of 3 keV and a dose of $1\times10^{15}$ cm$^{-2}$ (represented by a symbol like 1E15) to form n-type extensions Exn, and ions, e.g., B ions, are implanted at an acceleration energy of 10 keV to 15 keV and a dose of $2\times10^{13}$ cm$^{-2}$ (2E13) to $4\times10^{13}$ cm$^{-2}$ (4E13) along symmetric four directions slanted from the substrate normal to form p-type pocket regions Pkp surrounding the n-type extensions Exn.

With respect to the PMOS region, ions, e.g., B ions, are implanted into the n-type well NW at an acceleration energy of 0.5 keV and a dose of $1\times10^{15}$ cm$^{-2}$ (1E15) to form p-type extensions Exp, and ions, e.g., As ions, are implanted at an acceleration energy of 30 keV to 60 keV and a dose of 1E13 to 3E13 along symmetric four directions slanted from the substrate normal to form n-type pocket regions Pkn surrounding the p-type extensions Exp. Since the pocket region has the same conductivity type as the well, the pocket region will be omitted in the following drawings.

Figure 1D:
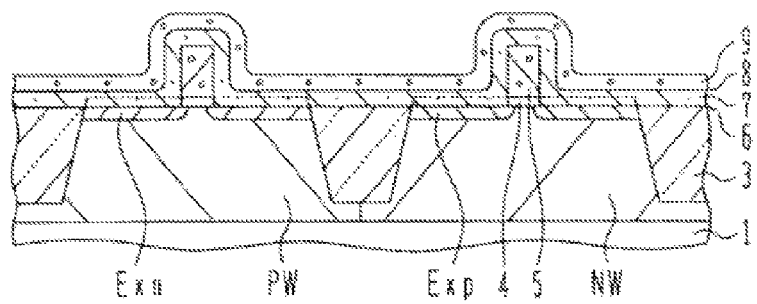
Figure 1E:
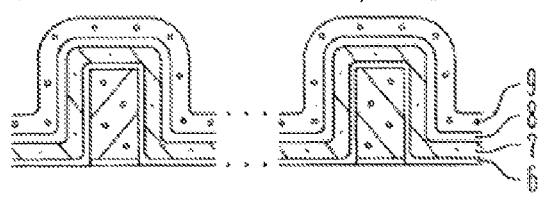

As illustrated in FIGS. 1D and 1E, a lamination for forming side wall spacers is deposited covering the gate electrode. FIG. 1E is a partially enlarged view of FIG. 1D. In order to narrow a gate pitch, the side wall spacer is preferably made thin. In order to suppress the short channel effects, the deep diffusion regions (source/drain regions) are preferably spaced from the gate electrode by some distance. When an epitaxial crystal having a lattice constant larger than Si is buried in a recess, it is not preferable that the hetero interface of the epitaxial layer forms a pn junction. The hetero pn junction may cause leak current thereacross. It is preferable to form a diffusion layer of the same conductivity type covering the epitaxial layer. A structure using side wall spacers of an L-shape satisfies these requirements.

First, by CVD at about 500° C. to 600° C., a silicon oxide film 6 is deposited on the silicon substrate to a thickness of about 3 nm, then a silicon nitride film 7 is deposited to a thickness of about 10 nm to 15 nm, and a silicon oxide film 8 is deposited to a thickness of about 6 nm, in this order. In this manner, an insulating lamination of a three-layer structure is formed by CVD. Source gases may be $SiH_2Cl_2$ and $N_2O$ for silicon oxide, and $SiH_2Cl_2$ and $NH_3$ for silicon nitride, etc.

It is sufficient if the silicon oxide film 6 provides a function of a buffer layer, and a thickness thereof is preferably 3 nm or thinner. It is also possible to omit the silicon oxide film 6. It is preferable that the silicon nitride film 7 functions sufficiently as an etch stopper and has tensile stress. A thickness of the silicon nitride film 7 is preferably 10 nm or thicker. It is sufficient if the silicon oxide film 8 provides a function of an etch stopper while a sacrificial layer formed thereon is etched, and a thickness thereof may be 2 nm or thinner.

An amorphous silicon (a-Si) film 9 having a thickness of 10 nm to 15 nm is deposited on the insulating lamination of three layers of the silicon oxide film/silicon nitride film/silicon oxide film, by pyrolysis CVD using $SiH_4/H_2$ gas preferably at a substrate temperature of 500° C. or lower. Although a poly-silicon (poly Si) film may be deposited by CVD at a temperature of 550° C. or higher, a lower deposition temperature is desired in order to suppress re-diffusion of impurity distribution. A total thickness of the insulating lamination and sacrificial film is set to a thickness suitable for forming the side wall spacer to be used when a deep diffusion layer is formed.

Figure 1F:
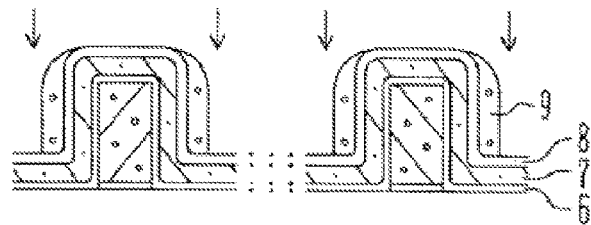

As illustrated in FIG. 1F, by using the silicon oxide film 8 as an etch stopper, the amorphous silicon film 9 is etched by anisotropic dry etching using HBr, to leave the amorphous silicon film only on the side walls of the gate electrode structure in a side wall spacer shape.

Figure 1G:
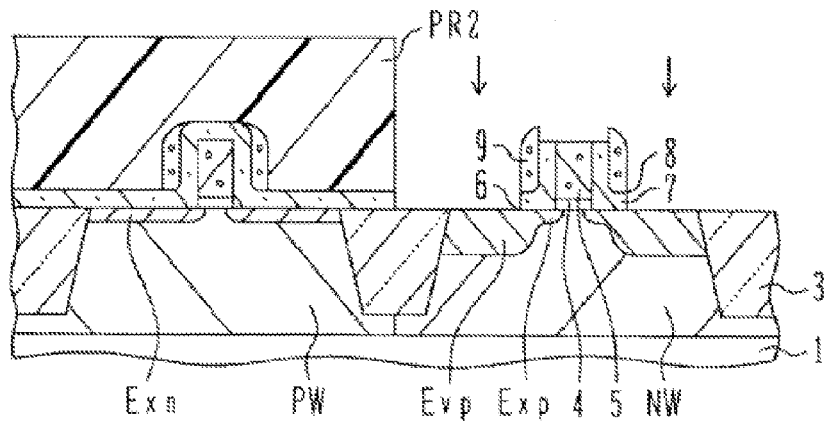

As illustrated in FIG. 1G, the NMOS region is covered with a photoresist pattern PR2 in the state in which the amorphous silicon film 9 was changed to the side wall spacer shape, and the silicon oxide film 8, silicon nitride film 7 and silicon oxide film 6 are still not etched. In the PMOS region, by using the amorphous silicon film 9 as an etching mask, the silicon oxide film 8, silicon nitride film 7 and silicon oxide film 6 are anisotropically dry-etched. Etching gas may be $CF_4/N_2$ mixed gas for SiO, and $CF_4$ for SiN, etc.

In the PMOS region, the silicon oxide film 8, silicon nitride film 7 and silicon oxide film 6 in an area not covered with the amorphous silicon film 9 are etched, and the side wall spacers are left. The surface of the silicon substrate is exposed in the PMOS region outside the side wall spacers. If the patterns of the hard mask layer HM illustrated in FIG. 1CX are left, the gate electrode 5 is covered with the pattern of the hard mask layer HM. If the hard mask layer HM is not used, the gate electrode 5 is also exposed.

In this state, B ions are implanted into the PMOS region, for example, at an acceleration energy of 40 keV and a dose of 1E13 to form a p-type envelope region Evp. The p-type envelope region Evp is implanted in the region outside the side wall spacers, which include the lamination of the insulating films 6, 7 and 8 and the sacrificial film 9, formed on the side walls of the gate electrode 5. The envelope region Evp also distributes on the gate electrode side by a distance corresponding to spreading of the ion implantation. Thereafter, the photoresist pattern PR2 is removed.

In the p-type envelope region Evp, recess is formed and epitaxial growth is performed in later processes. Therefore, the epitaxial region is enclosed within the p-type envelope region Evp, and a hetero interface is formed inside the pn junction front. The epitaxial regions and envelope regions are collectively called source/drain regions in some cases.

Figure 1H:
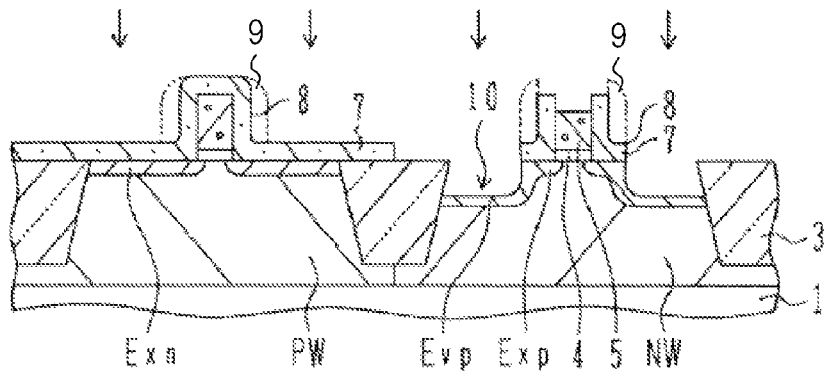
Figure 1I:
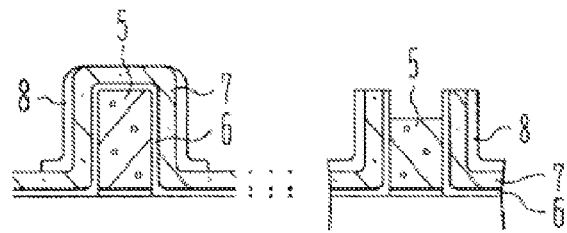

As illustrated in FIGS. 1H and 1I, chemical dry etching is performed for the silicon substrate. FIG. 1I is a partially enlarged view of FIG. 1H. The silicon substrate in the NMOS region is covered with the insulating lamination 6, 7 and 8. In the PMOS region, the surface of the silicon substrate is exposed in an area outside the side wall spacers. The surface of the Si substrate is subjected to chemical dry etching using $CF_4/O_2$ as etchant gas. For example, a pressure is 50 Pa and an applicator power is 100 W.

This chemical dry etching digs the silicon surface exposed in the PMOS region to a depth of about 50 nm to form recesses 10 in which Si—Ge mixed crystal is to be epitaxially grown. This chemical dry etching not only etches the substrate silicon but also etches the amorphous silicon films 9 on the side walls of the gate electrode at the same time. The silicon oxide film 8 in the NMOS region not covered with the amorphous silicon film is also etched. The silicon nitride film 7 is not etched. The silicon oxide film 8 under the amorphous silicon film 9 is left by utilizing an end point monitor by oxygen. At this time, the amorphous silicon films 9 on the side walls are perfectly removed.

Since the amorphous silicon films 9 of side wall spacers are removed, the side wall spacer on the side wall of the gate electrode becomes thin. The bottom wall of the three-layer lamination structure projects laterally by a distance corresponding to the thickness of the amorphous silicon film 9. A projection length is approximately 7 nm or longer. The side walls of the gate electrode retain the insulated state by the insulating lamination of the silicon oxide film 8, silicon nitride film 7 and silicon oxide film 6.

Thereafter, an HF process is executed slightly as a preparatory process for epitaxial growth to remove a thin (natural)

oxide film on the silicon surface. A wet etching amount is adjusted to leave the silicon oxide film 8.

Figure 1J:
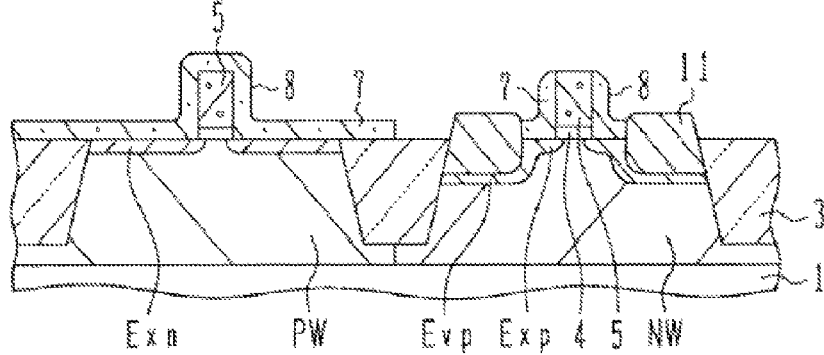

As illustrated in FIG. 1J, selective epitaxial growth of a B-doped Si—Ge layer 11 is performed by using a gas system of $HCl/B_2H_6/SiH_4/GeH_4/H_2$, for example, at a substrate temperature of 600° C. A thickness of the grown film is about 60 nm. Since HCl removes fine nuclei on the insulating film, crystal growth does not occur on the insulating film. The recess 10 is filled with p-type Si—Ge mixed crystal 11 having a lattice constant larger than silicon and epitaxially grown. The upper surface of Si—Ge crystal epitaxially grown in the recess, which has a depth of about 50 nm, bulges above the silicon substrate surface. This bulged region applies compressive stress effectively to the channel region under the gate electrode 5. A Ge composition of Si—Ge mixed crystal is preferably 20 at % or smaller. Instead of Si—Ge, C-added Si—Ge, Si—Ge—C, may be epitaxially grown. Although lattice mismatch becomes smaller, stability is improved. If C is added, the Ge composition is preferably 25% to 30%. Si—Ge crystal and Si—Ge—C crystal are collectively called Si—Ge-containing crystal in some cases.

Figure 1K:
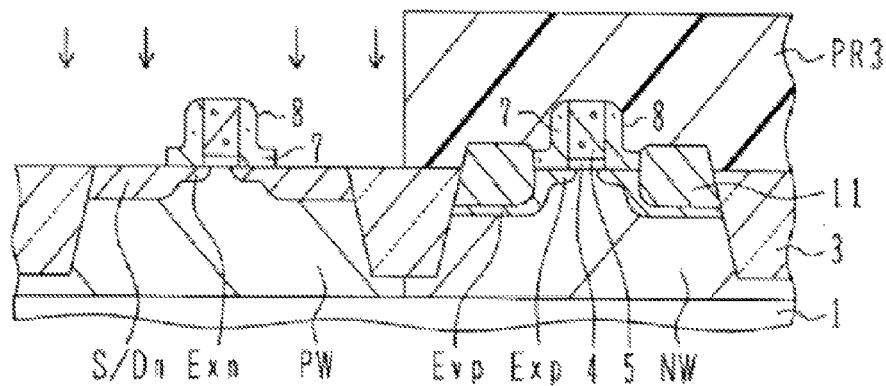

As illustrated in FIG. 1K, the PMOS region is covered with a photoresist pattern PR3, and the SiN film 7 on the NMOS region is anisotropically dry-etched by using $CF_4$ as etching gas. Since the silicon oxide film 8 not covered with the silicon film of the side wall shape was removed by etching illustrated in FIGS. 1H and 1I, the silicon nitride 7 exposed outside the silicon oxide film 8 is etched. The silicon nitride film 7 covered with the silicon oxide film 8 is not etched, and is left in an L-shape together with the silicon oxide film 8.

Next, source/drain forming impurity ions are implanted into the NMOS region deeper than the extensions Exn at a high concentration to form deep and low resistivity source/drain regions S/Dn. For example, P ions are implanted at an acceleration energy of 10 keV and a dose of $6 \times 10^{15}$ cm$^{-2}$ (6E15). The photoresist pattern PR3 is thereafter removed. Rapid thermal annealing (RTA) is performed, for example, for 2 seconds or shorter at 1000° C., to execute an activation process for activating implanted impurity ions in a short time.

Figure 1L:
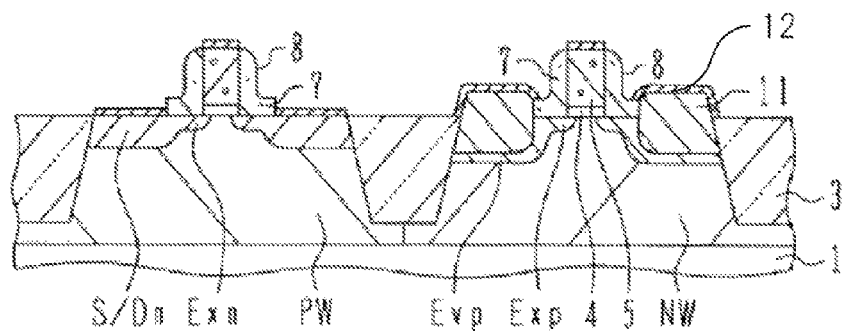

As illustrated in FIG. 1L, a Ni layer is deposited on the whole substrate surface to a thickness of about 15 nm by sputtering. Annealing process is performed at a temperature of about 350° C., to cause a silicidation reaction. Unreacted Ni layer is removed, for example, by $HNO_3$ washing. A silicide layer 12 is left on the gate electrodes, on the source/drain regions in the NMOS region, and on the Si—Ge epitaxial layers 11 in the PMOS region. A thickness of the silicide layer 12 is about 20 nm. Care is paid not to form nickel disilicide which has high resistance and is likely to be crystallized.

Figure 1M:
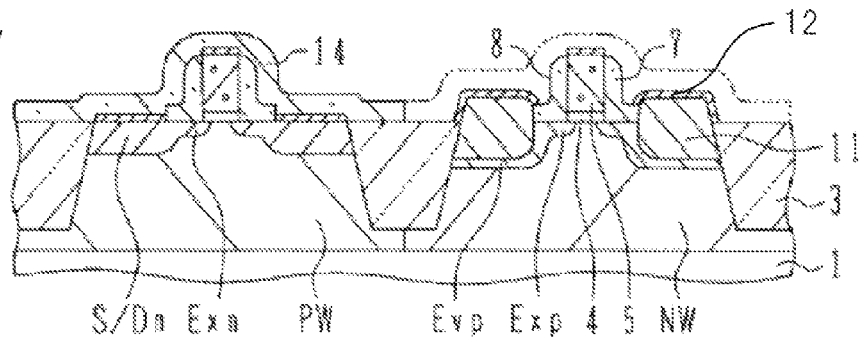

As illustrated in FIG. 1M, a silicon nitride film 14 having tensile intrinsic stress is deposited on the substrate to a thickness of 100 nm by plasma-enhanced CVD, for example, under the following conditions. $SiH_4$, $NH_3$ and $N_2$ are used as source gases, a growth temperature is 250° C. to 450° C., and an atmospheric pressure during frowth is 2 Torr to 5 Torr. Since the silicon nitride film 14 is formed on the side wall spacer with the L-shaped cross section formed by removing the sacrificial film, a distance from the silicon nitride film to the channel becomes shorter. It is considered that stress can be applied effectively.

A photoresist pattern is formed covering the NMOS region, and the silicon nitride film 14 having the tensile intrinsic stress in the PMOS region is removed. The photoresist pattern covering the NMOS region is thereafter removed.

Figure 1N:
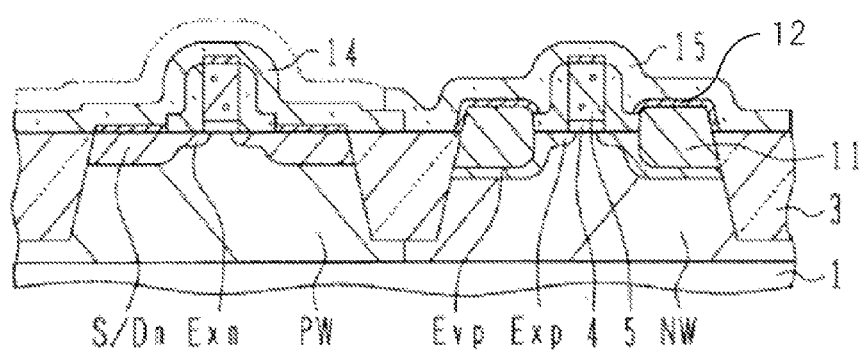
Figure 10:
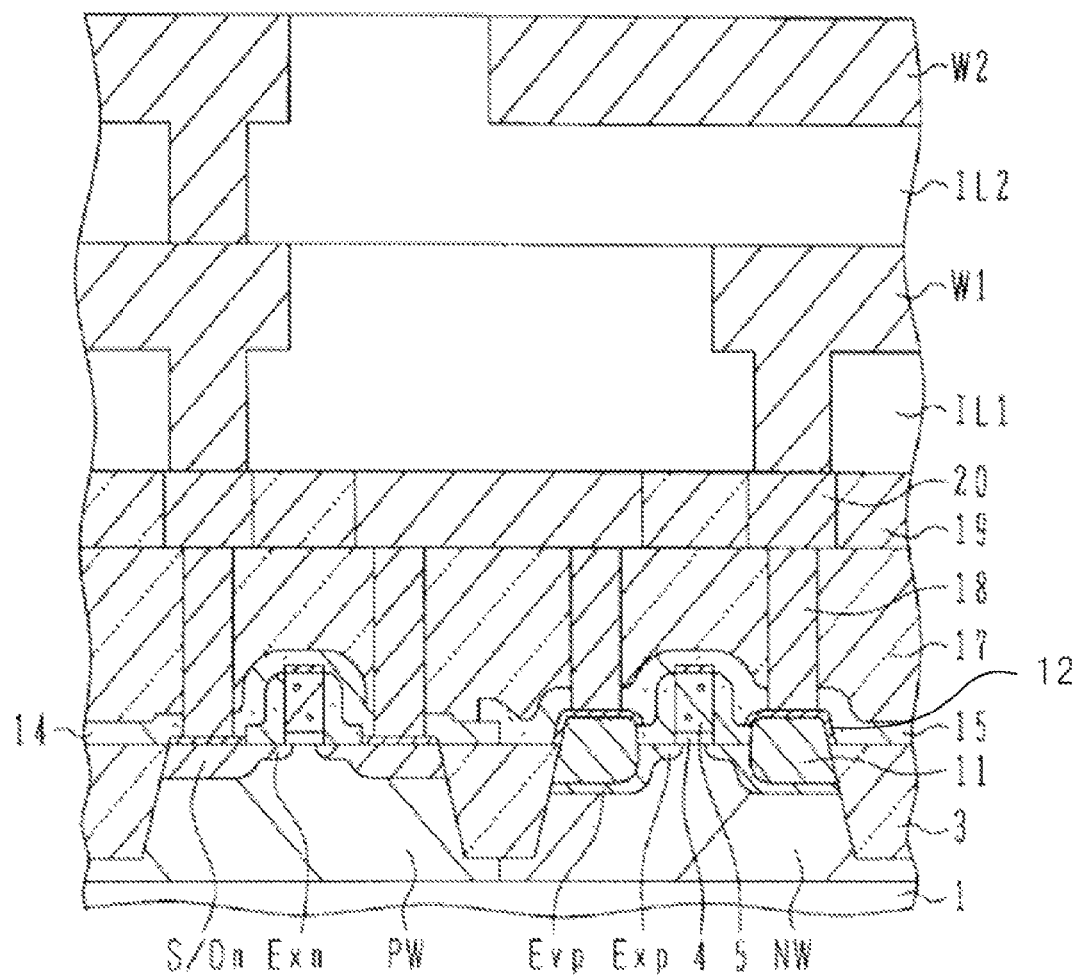

As illustrated in FIG. 1N, a silicon nitride film 15 having compressive intrinsic stress is deposited on the substrate to a thickness of 100 nm by plasma-enhanced CVD, for example, under the following conditions. Organo silane, $NH_3$ and $N_2$ are used as source gases, a growth temperature is 250° C. to 450° C., and an atmospheric pressure during growth is 2 Torr to 5 Torr. Since the silicon nitride film 15 is formed on the side wall spacer with the L-shaped cross section formed by removing the sacrificial film, a distance from the silicon nitride film to the channel becomes shorter. It is considered that stress can be applied effectively.

A photoresist pattern is formed covering the PMOS region, and the silicon nitride film 15 having the compressive intrinsic stress in the NMOS region is removed. The photoresist pattern covering the PMOS region is thereafter removed.

In the manner described above, it s possible to cover the surface of the NMOS region with the etch stopper having tensile stress, to bury Si—Ge epitaxial crystal having a lattice constant larger than silicon in the recesses, and to cover the surface of the PMOS region with the etch stopper having compressive stress.

As illustrated in FIG. 1O, a silicon oxide film 17 is deposited on the substrate by plasma-enhanced CVD, and the surface thereof is planarized by chemical mechanical polishing (CMP). A photoresist pattern having openings corresponding to contact holes is formed on the silicon oxide film 17. Contact holes are formed extending through the silicon oxide film 17 and reaching the etch stopper silicon nitride films 14 and 15 by dry etching using mixed gas of $CF_4/N_2$. By changing etching gas to $CF_4$, the silicon nitride films 14 and 15 are etched to complete the contact holes exposing the silicide layers. Ti/TiN or the like is sputtered to form barrier layers, and W layers are formed by CVD using $WF_6/H_2$ to bury conductive plugs 18 in the contact holes. Metal layers unnecessarily formed on the silicon oxide film 17 are removed by CMR An insulating layer 19 such as silicon oxide is deposited by CVD, covering the conductive plugs 18. Wiring trenches are etched in the insulating layer 19. A barrier layer of TaN or the like and a copper seed layer are deposited by sputtering on the substrate provided with the wiring trenches, a copper layer is plated to fill the trench. Metal layers unnecessarily formed on the insulating layer 19 are removed by CMP to form copper wirings 20. Interlayer insulating films IL1 and IL2 are formed in which damascene copper wirings W1 and W2 are buried. Damascene wirings are formed by processes similar to the above-described processes. The lowest interlayer insulating film includes a copper diffusion preventive film of SiC, SiN, SiCN or the like. An organic insulating resin such as SiLK (registered trademark), a porous silica film or the like may be used as the main interlayer insulating film.

In the first embodiment, a lamination of the insulating film and a sacrificial film is formed to form the side wall spacers on the side walls of the gate electrode. In the PMOS region, the recesses are formed and the sacrificial film is etched and removed, in the same process. It is possible to form the recesses and thin the side wall spacers. If dry etching is performed after the epitaxial growth to thin the side wall spacers, damages may be introduced into the epitaxial layer. These demerits are avoided.

By forming the oxide film on the nitride film, the side wall spacers of the L-shape are formed also in the NMOS region so that the source/drain regions S/Dn are spaced from the gate electrode. If only PMOS transistors are formed, the silicon oxide film 8 on the silicon nitride film 7 may be omitted. A lamination of the insulating film and sacrificial film is formed, first the sacrificial film is anisotropically etched to form the side wall spacers, ion implantation for forming envelope regions is performed, the sacrificial film is etched simultaneously with etching the recesses.

Although sacrificial film etching and recess etching are performed by isotropic chemical etching, etching is not limited thereto. For silicon etching for forming the recesses in the silicon substrate illustrated in FIG. 1H, a combination of anisotropic etching and isotropic etching may be used. For example, first ordinary anisotropic dry etching is performed under the conditions of etching gas of $CF_4/O_2$, a pressure of 20 Pa, and a applicator power of 200 W, and thereafter, isotropic wet etching is performed with 10% diluted trimethylammoniumhydride (TMAH). Isotropic chemical etching may also be performed. Although residues are left on the side walls of the gate electrode during anisotropic dry etching, it is possible to remove completely the residues by the succeeding isotropic etching.

FIGS. 2A to 2D are cross sectional views of a semiconductor substrate illustrating main processes of a method for manufacturing a semiconductor device according to the second embodiment. The processes of isolation, well formation, gate electrode formation and extension formation illustrated in FIGS. 1A to 1C of the first embodiment are executed first.

Figure 2A:
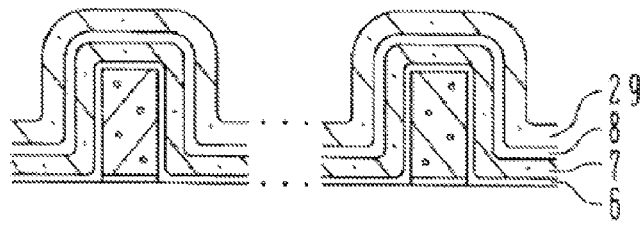
FIGS. 2A to 2D are cross sectional views of a semiconductor substrate illustrating main processes of a method for manufacturing a complementary type semiconductor device according to a second embodiment.

As illustrate in FIG. 2A, a lamination structure for forming side wall spacers is deposited on a silicon substrate, covering the gate electrodes. A silicon oxide film 6 having a thickness of about 3 nm/a silicon nitride film 7 having a thickness of about 10 nm to 15 nm/and a silicon oxide film 8 having a thickness of about 6 nm are deposited by CVD at a temperature of about 500° C. to 600° C. Up to this process, the processes are similar to the first embodiment. Next, a silicon nitride film 29 is deposited to a thickness of about 10 nm to 15 nm at a substrate temperature of 400° C. to 500° C., and at a power of 100 W to 300 W, by plasma enhanced CVD (PE-CVD) using $SiH_4/NH_3$ as source gases.

Figure 2B:
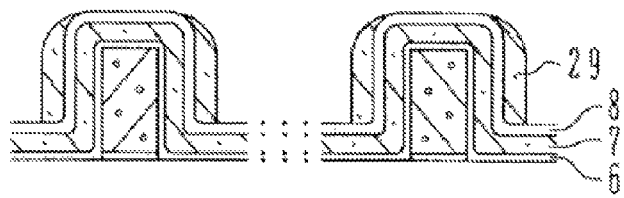

As illustrated in FIG. 2B, the PE-CVD silicon nitride film 29 is anisotropically dry-etched using $CF_4$ as etching gas, to leave the silicon nitride film only on the side walls of the gate electrodes in a side wall spacer shape.

Figure 2C:
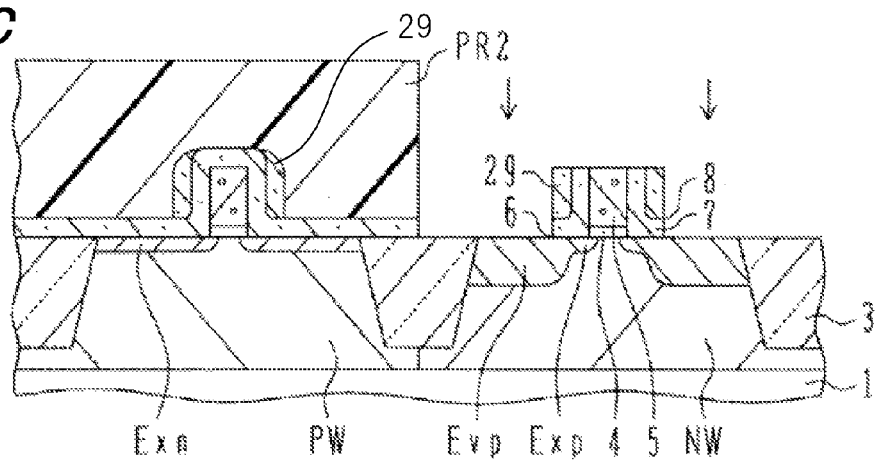

As illustrated in FIG. 2C, in the state in which the silicon oxide film 8, silicon nitride film 7 and silicon oxide film 6 are not etched yet, the NMOS region is covered with a resist pattern PR2. In the PMOS region, by using the side wall spacers 29 of the silicon nitride film as an etching mask, the silicon oxide film 8, silicon nitride film 7 and silicon oxide film 6 are anisotropically dry-etched to leave side wall spacers on the side walls of the gate electrode. The insulating lamination on the upper surface of the gate electrode is also removed. Etching gas may be $CF_4/N_2$ for silicon oxide, and $CF_4$ for silicon nitride. In the PMOS region, the silicon substrate surface outside the side wall spacers is exposed.

B ions are implanted into the PMOS region to form deep p-type envelope regions Evp. The p-type envelope region Evp is the region for covering a hetero interface to be later formed. The photoresist pattern PR2 is thereafter removed.

Figure 2D:
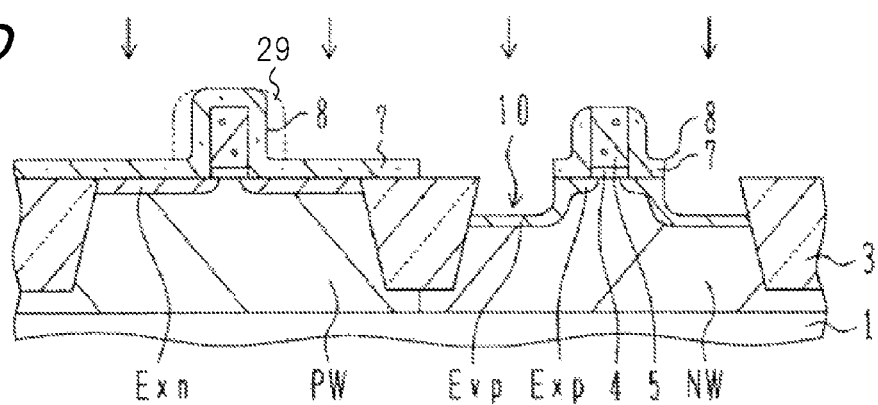

As illustrated in FIG. 2D, in the PMOS region, chemical dry etching is performed for the silicon substrate which has the source/drain regions exposed, by using $CF_4/O_2$ as etchant gas. For example, a pressure is 50 Pa and an applicator power is 100 W. This chemical dry etching digs the silicon surface exposed in the PMOS region to a depth of about 50 nm to form recesses 10 in which Si—Ge mixed crystal is to be epitaxially grown.

As compared with a silicon nitride film formed by thermal CVD, the silicon nitride film 29 formed by PE-CVD lowers considerably an etching selectivity with respect to silicon. This chemical dry etching not only etches the substrate silicon but also etches the PE-CVD silicon nitride film 29 on the side walls of the gate electrodes. The exposed silicon oxide film 8 in the NMOS region is also etched. The silicon oxide film 8 under the silicon nitride film 29 is left in the L-shape. In the PMOS region, the silicon oxide film 8 and underlying silicon nitride 7 are left in the L-shape. The PE-CVD silicon nitride films 29 on the side walls are removed completely. In the NMOS region, the PE-CVD silicon nitride films 29 and exposed silicon oxide films are removed.

The side wall spacers of the PE-CVD silicon nitride films 29 are removed, and the side wall spacers on the side walls of the gate electrodes are thinned. The bottom wall of the three-layer lamination structure projects in a lateral direction by a distance corresponding to the thickness of the PE-CVD silicon nitride film 29. A projection length is approximately 7 nm or longer. The side walls of the gate electrodes retain the insulated state by the insulating lamination of the silicon oxide film 8, silicon nitride film 7 and silicon oxide film 6.

Thereafter, an HF process is executed slightly as a preparatory process for epitaxial growth to remove a thin (natural) oxide film on the silicon surface. Thereafter, processes corresponding to FIGS. 1J to 1O of the first embodiment are executed to complete a semiconductor device. In the NMOS region, the silicon nitride film 7 covered with the silicon oxide film 8 is left in the L-shape to constitute thinned side wall spacers. An etch stopper containing stress is formed covering the thinned side wall spacers.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What are claimed are:

1. A method for manufacturing a semiconductor device comprising:
   (a) forming a gate electrode on a silicon substrate, through a gate insulating film;
   (b) forming a lamination of an insulating film and a sacrificial film having different etching characteristics on the silicon substrate, covering said gate electrode, and anisotropically etching the lamination to form side wall spacers on side walls of the gate electrode and the gate insulating film;
   (c) implanting impurities into the silicon substrate on both sides of the side wall spacers;
   (d) etching the silicon substrate and a portion of the lamination of the side wall spacers to form recesses in the silicon substrate, and to change a cross sectional shape of each of the side wall spacers to approximately an L-shape;
   (e) epitaxially growing Si—Ge-containing crystal in the recesses; and
   (f) depositing an insulating film containing stress, covering the side wall spacers.

2. The method for manufacturing a semiconductor device according to claim 1, wherein said step (d) etches said sacrificial film.

3. The method for manufacturing a semiconductor device according to claim 1, wherein said insulating film includes an SiN film.

4. The method for manufacturing a semiconductor device according to claim 3, wherein said insulating film includes said SiN film and a silicon oxide film formed thereon.

5. The method for manufacturing a semiconductor device according to claim 4, further comprising:

(g) executing a wet process using HF between said steps (d) and (e) to remove an oxide film on surfaces of said recesses, while leaving said silicon oxide film of said side wall spacers.

6. The method for manufacturing a semiconductor device according to claim 1, wherein said sacrificial film is an amorphous Si film.

7. The method for manufacturing a semiconductor device according to claim 6, wherein said step (b) comprises a step of forming said amorphous Si film by CVD at a temperature not higher than 500° C.

8. The method for manufacturing a semiconductor device according to claim 1, wherein said sacrificial film is an SiN film.

9. The method for manufacturing a semiconductor device according to claim 8, wherein said step (b) comprises a step of forming said SiN film by plasma-enhanced CVD at a temperature not higher than 500° C.

10. The method for manufacturing a semiconductor device according to claim 1, wherein said step (f) forms an SiN film having compressive stress by plasma-enhanced CVD.

11. The method for manufacturing a semiconductor device according to claim 1, wherein said step (d) performs dry etching using mixed gas of $CF_4$ and $O_2$.

12. A method for manufacturing a semiconductor device comprising:

(a) forming a gate electrode on a silicon substrate through a gate insulating film;

(b) forming lamination of an insulating film including an SiN film and a silicon oxide film covering said SiN film, and a sacrificial film of amorphous Si or SiN, on said silicon substrate, said lamination covering said gate electrode, and anisotropically etching the lamination to form side wall spacers on side walls of said gate electrode and said gate insulating film;

(c) implanting impurities into said silicon substrate on both sides of said side wall spacers;

(d) etching said silicon substrate and said sacrificial film of said side wall spacers and stopping etching at said silicon oxide film to form recesses in said silicon substrate, and to change a cross section of each of said side wall spacers to approximately an L-shape;

(e) epitaxially growing Si—Ge-containing crystal in said recesses; and (f) depositing an SiN film containing stress, covering said side wall spacers.

13. The method for manufacturing a semiconductor device according to claim 12, wherein said step (b) forms said insulating film by stacking from a lower side, a silicon oxide film, a silicon nitride film and a silicon oxide film.

14. The method for manufacturing a semiconductor device according to claim 13, wherein said step (d) performs dry etching using mixed gas of $CF_4$ and $O_2$.

* * * * *